(12) United States Patent
Rutenbar et al.

(10) Patent No.: US 7,920,992 B2
(45) Date of Patent: Apr. 5, 2011

(54) METHOD AND SYSTEM FOR MODELING UNCERTAINTIES IN INTEGRATED CIRCUITS, SYSTEMS, AND FABRICATION PROCESSES

(75) Inventors: Rob A. Rutenbar, Pittsburgh, PA (US);
James D. Ma, Baltimore, MD (US);
Claire F. Fang, Pittsburgh, PA (US);
Amith Singhee, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 879 days.

(21) Appl. No.: 11/370,711

(22) Filed: Mar. 8, 2006

(65) Prior Publication Data
US 2006/0206294 A1 Sep. 14, 2006

Related U.S. Application Data

(60) Provisional application No. 60/660,401, filed on Mar. 10, 2005.

(51) Int. Cl.
*G06F 17/10* (2006.01)
(52) U.S. Cl. ............................................. 703/2; 703/13
(58) Field of Classification Search .................. 703/2, 13, 703/19
See application file for complete search history.

(56) References Cited

U.S. PATENT DOCUMENTS
2004/0243375 A1* 12/2004 Kundert .......................... 703/14

OTHER PUBLICATIONS

Harkness, Cheryl L., et al., Interval Methods for Modeling Uncertainty in RC Timing Analysis, IEEE Transactions on Computer-Aided Design, vol. 11, No. 11, pp. 1388-1401, Nov. 1992.
Visweswariah, C., et al., First-Order Incremental Block-Based Statistical Timing Analysis, pp. 331-336, (2004).
Shi, Richard, C.-J., et al., Simulation and Sensitivity of Linear Analog Circuits Under Parameter Variations by Robust Interval Analysis, ACM Transactions on Design Automation of Electronic Systems, vol. 4, No. 3, pp. 280-312, Jul. 1999.
Stolfi, J. and De Figueiredo, L.H., "Self-Validating Numerical Methods and Applications," in Brazilian Mathematics Colloquium Monograph, IMPA, Rio De Janeiro, Brazil, 1997. 121 pages.
Fang, C.F., "Probabilistic Interval-Valued Computation: Representing and Reasoning About Uncertainty in DSP and VLSI Designs," Ph.D. disseratation, Department of Electrical and Computer Engineering, Carnegie Mellon University, Pittsburgh, PA, 2005. 200 Pages.
Ma, J.D. and Rutenbar, R.A., "Interval-Valued Reduced Order Statistical Interconnect Modeling", in Proc. Int. Conf. Computer Aided Design, 2004, pp. 460-467.

* cited by examiner

*Primary Examiner* — Paul L Rodriguez
*Assistant Examiner* — Luke Osborne
(74) *Attorney, Agent, or Firm* — Charles L. Moore; Moore & Van Allen PLLC

(57) ABSTRACT

A method and system for modeling uncertainties in integrated circuits, systems and fabrication processes may include defining interval values for each uncertain component or parameter in a circuit or system. The method may also include replacing scalar operations with interval operations in an algorithm and discontinuing interval operations in the algorithm in response to a predetermined condition. The method may also include generating a plurality of scalar samples from a plurality of intervals and determine a distribution of each uncertain component or parameter from the scalar samples of the intervals.

24 Claims, 11 Drawing Sheets

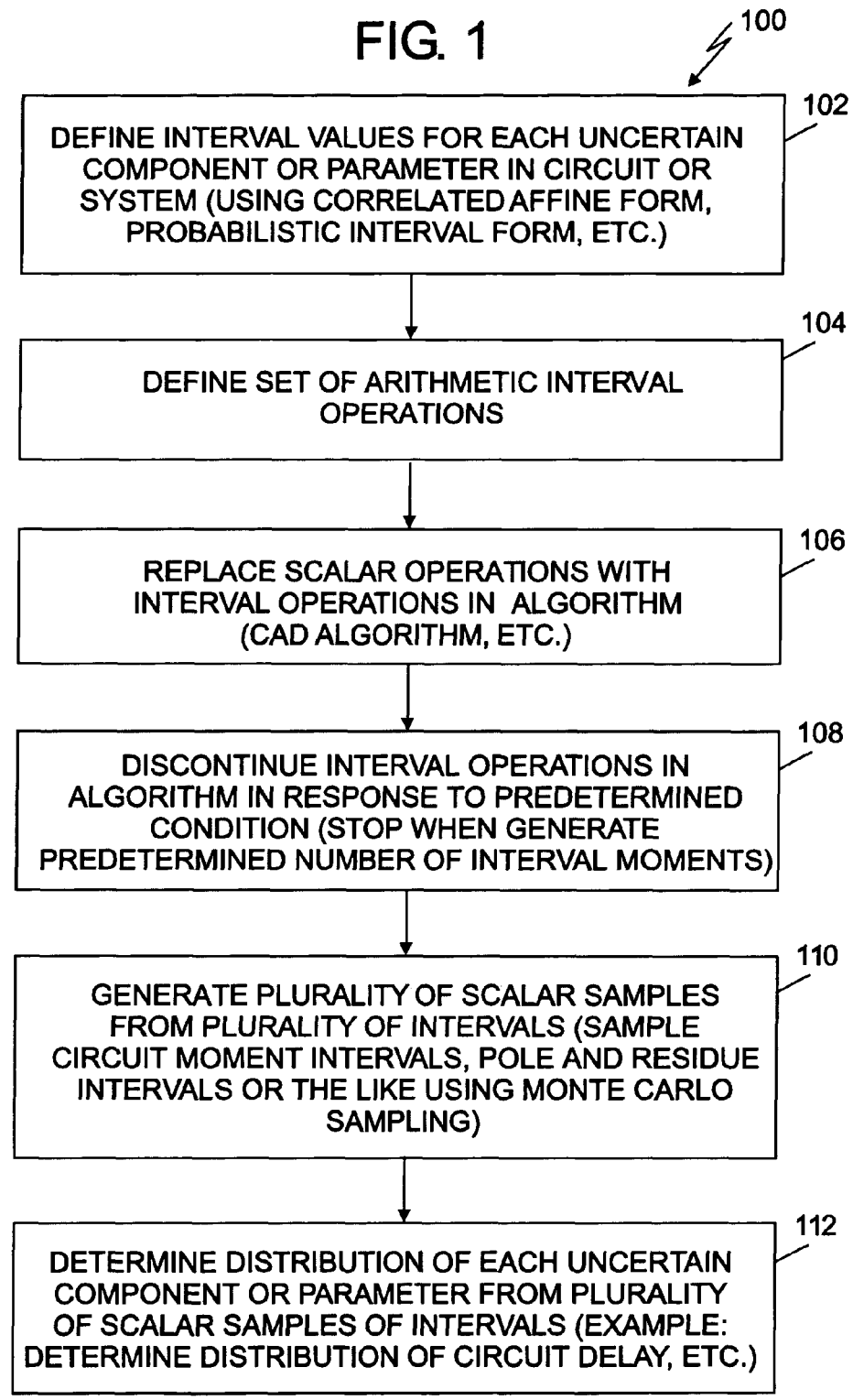

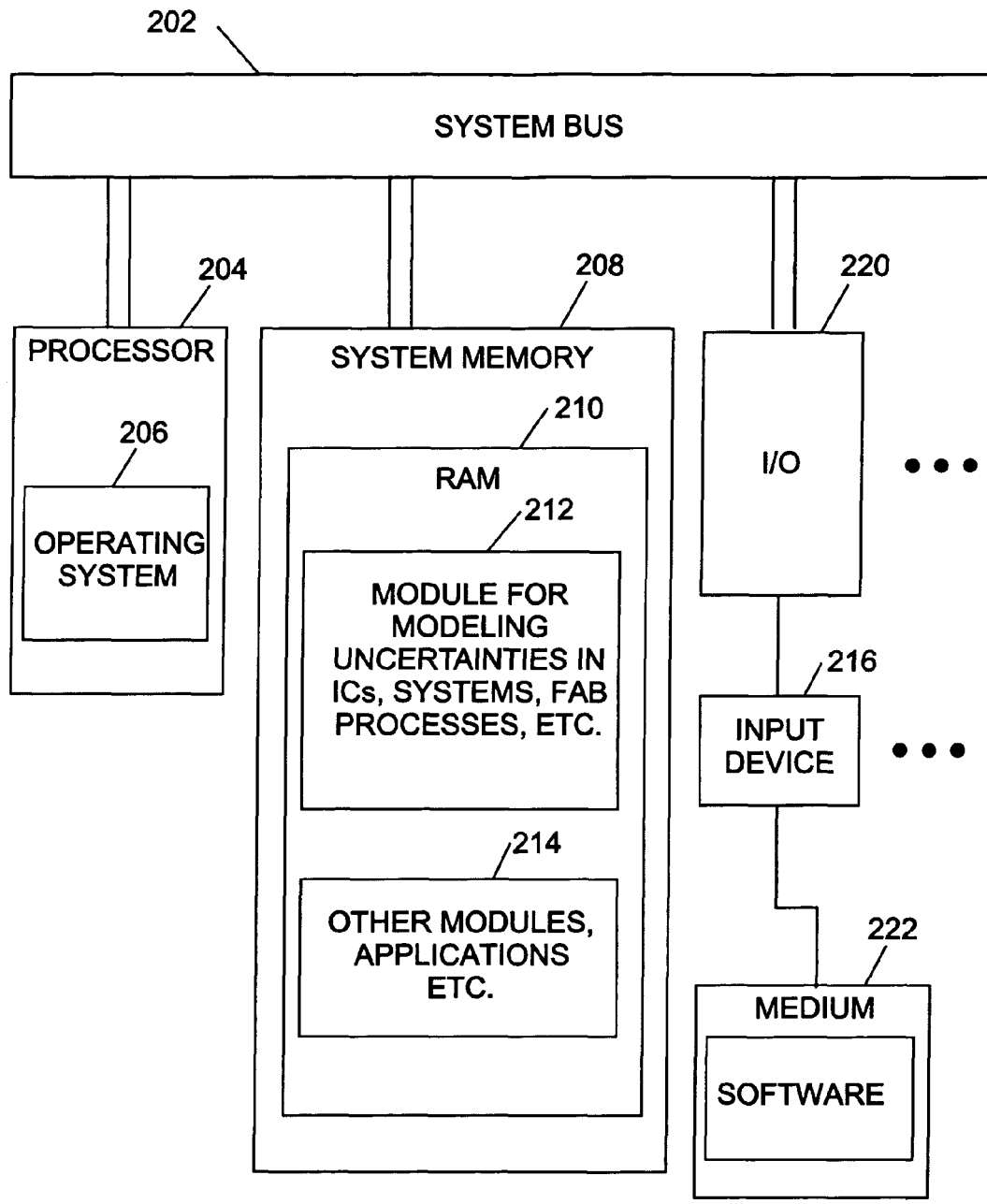

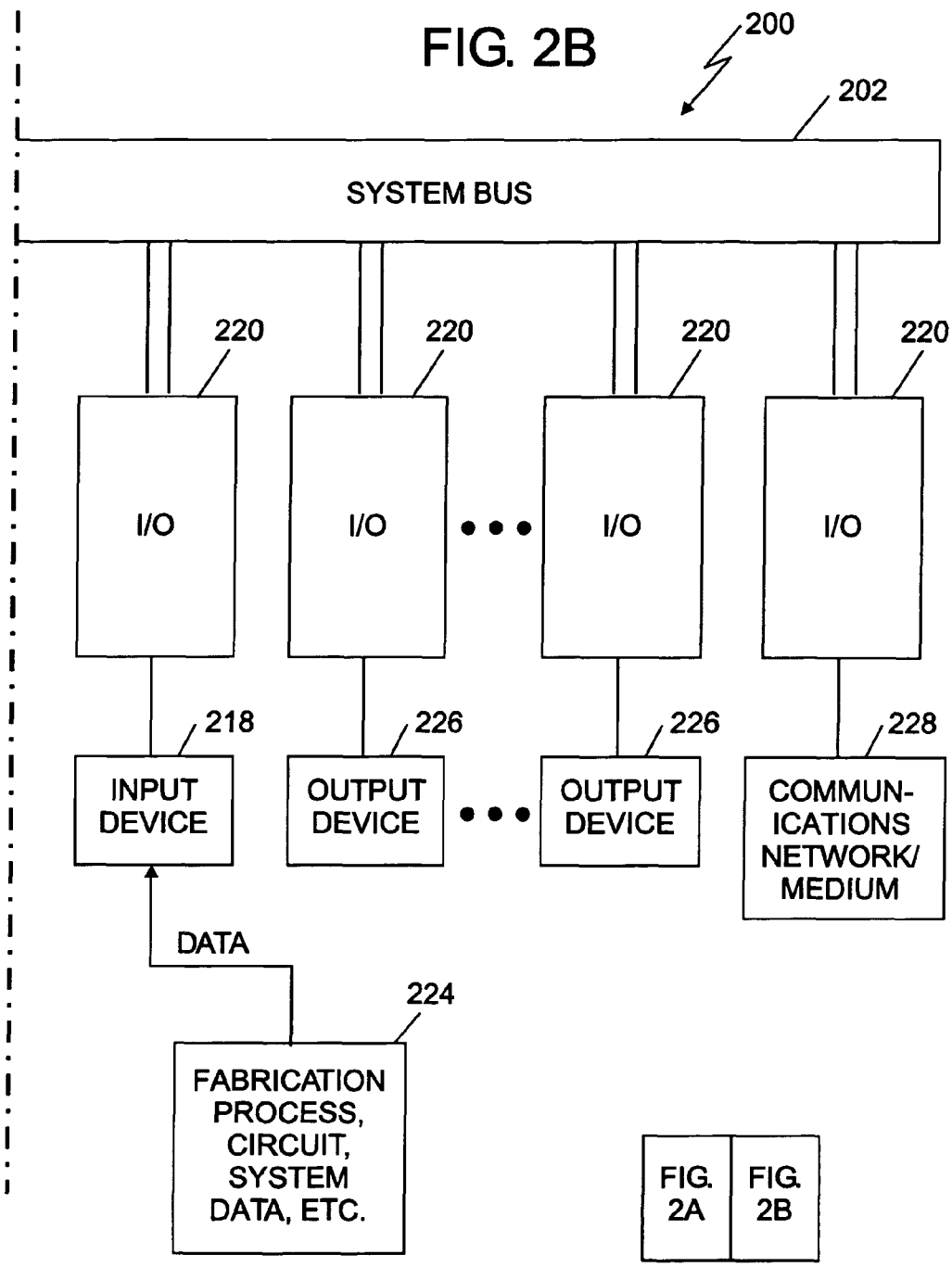

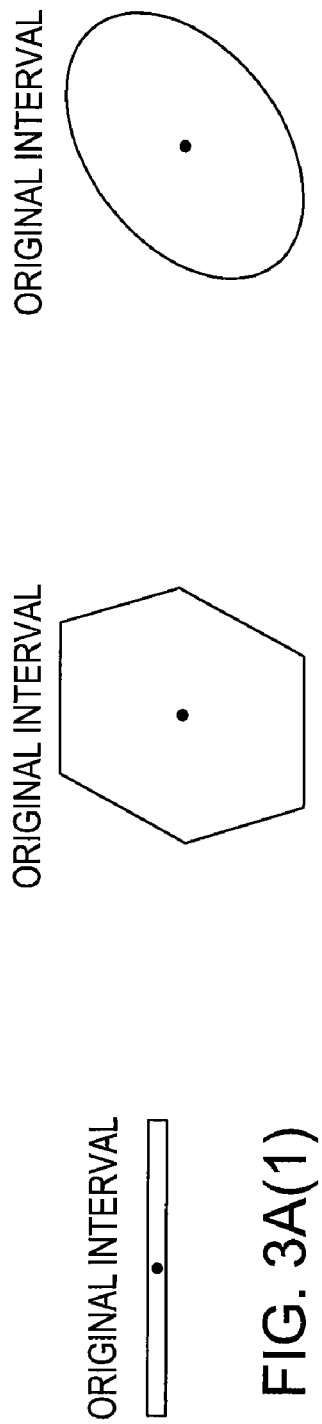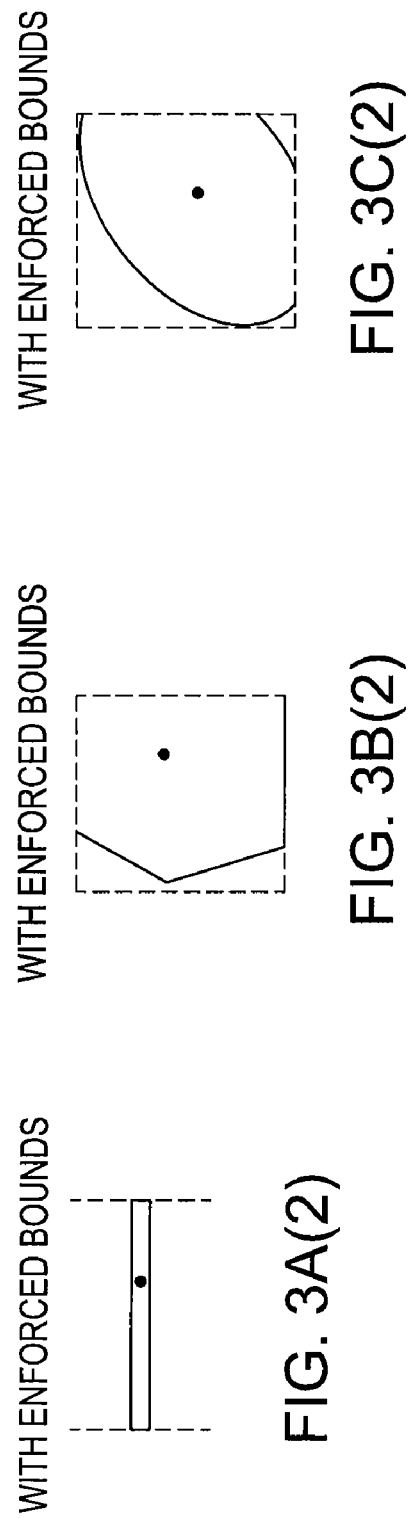

Input: $\hat{x} = x_0 + \sum_{i=1}^{N} x_i \varepsilon_i, [x_l, x_h]$

Output: $\hat{y} = y_0 + \sum_{i=1}^{N} y_i \varepsilon_i, + \varepsilon_{N+1}, [y_l, y_h]$ $f(\hat{x}, x_l, x_h)\{$ $a = x_l$ $b = x_h$ $slope = \dfrac{f(b) - f(a)}{b-a}$ x equals the solution to $f'(x) = slope$ $c_1 = f(X) - slope \cdot x$ $c_2 = f(b) - slope \cdot b$ $\hat{y} = \hat{x} \cdot slope + \dfrac{c_1 + c_2}{2} + \dfrac{c_1 - c_2}{2} \varepsilon_{N+1}$ $y_l = \min(f(a), f(b))$ $y_h = \max(f(a), f(b))$ output $\{\hat{y}, y_l, y_h\}$ $\}$

FIG. 4

Input: $\hat{x} = x_0 + \sum_{i=1}^{N} x_i \varepsilon_i, [x_l, x_h]$

Input: $\hat{y} = y_0 + \sum_{i=1}^{N} y_i \varepsilon_i, [y_l, y_h]$

Output: $\hat{z} = z_0 + \sum_{i=1}^{N} z_i \varepsilon_i, + \varepsilon_{N+1}, [z_l, z_h]$ div ($\hat{x}, x_l, x_h, \hat{y}, y_l, y_h$) { if min ($N_1, N_2$) is small construct $U^{xy}$ as a constrained polygon $C_1 = \max(D(x,y))$ over $U^{xy}$ by polygon tracing $C_2 = \min(D(x,y))$ over $U^{xy}$ by polygon tracing $z_l = \min(x/y)$ over $U^{xy}$ polygon tracing $z_h = \max(x/y)$ over $U^{xy}$ polygon tracing else construct the bounding box of a confidence ellipse construct $U^{xy}$ as a constrained bounding box $C_1 = \max(D(x,y))$ over $U^{xy}$ by tracing the bounding box $C_2 = \min(D(x,y))$ over $U^{xy}$ by tracing the bounding box compute $z_l$ and $z_h$ using the inverse CDF of $z$ $$\hat{z} = \frac{\hat{x}}{y_0} - \frac{x_0}{y_0^2}\hat{y} + \frac{C_1+C_2}{2} + \frac{C_1-C_2}{2}\varepsilon_{N+1}$$

compute the implied probabilistic bounds $\underline{z}_\lambda$ and $\overline{z}_\lambda$ $z_l = \max(z_l, \underline{z}_\lambda)$ $z_h = \min(z_h, \overline{z}_\lambda)$ output $\{\hat{z}, z_l, z_h\}$

}

FIG. 10

METHOD AND SYSTEM FOR MODELING UNCERTAINTIES IN INTEGRATED CIRCUITS, SYSTEMS, AND FABRICATION PROCESSES

CROSS REFERENCE TO RELATED APPLICATIONS

This application is a Continuation of U.S. Provisional Application No. 60/660,401, filed Mar. 10, 2005 naming Rob A. Rutenbar et al., as the inventors. The content of this application is incorporated herein by reference in its entirety, and the benefit of the filing dates of this application is hereby claimed for all purposes that are legally served by such claim for the benefit of the filing date.

BACKGROUND

The present invention relates to integrated circuits, systems and fabrication processes and more particularly to a method and system for modeling uncertainties in integrated circuits, systems, fabrication processes or the like.

Manufacturing process variations are random and the true causes may be complicated. In general, the variations may be classified into two categories: global variations and local variations. Global variations, such as critical-dimension variations, are inter-die and can be assumed to affect all the devices and interconnections in a similar way across several different semiconductor chips or wafers. Local variations, such as metal width and thickness variations, are intra-die and often exhibit spatial correlations. For example, the device and interconnect parameters may be affected similarly by a common source of variation when these physical elements are close enough to each other. In the past, global variations dominated local variations but as semiconductor technology scales and die sizes grow, local variations are becoming as important as global variations. At 90 nanometers (nm) and below, device and interconnect parameters can no longer be regarded as being deterministic. The increasing atomic scale of manufacturing causes design parameters to be statistically distributed with complex correlations. The challenge is how to efficiently analyze critical devices, interconnects and circuit layouts under these circumstances.

BRIEF SUMMARY OF THE INVENTION

In accordance with an embodiment of the present invention, a method for modeling uncertainties in integrated circuits, systems, fabrication processes or the like may include defining interval values for each uncertain component or parameter in a circuit or system. The method may also include generating a plurality of scalar samples from a plurality of intervals. The method may further include determining a distribution of each uncertain component or parameter from the plurality of scalar samples of the intervals.

In accordance with another embodiment of the present invention, a method for modeling uncertainties in integrated circuits, systems, fabrication processes or the like may include defining interval values for each uncertain component or parameter in a circuit or system. The method may also include defining a set of arithmetical interval operations and replacing scalar operations with interval operations in an algorithm. The method may also include discontinuing interval operations in the algorithm in response to a predetermined condition and generating a plurality of scalar samples from a plurality of intervals. The method may further include determining a distribution of each uncertain component or parameter from the plurality of scalar samples of the intervals.

In accordance with another embodiment of the present invention, a system for modeling uncertainties in integrated circuits, systems, fabrication processes or the like may include a data structure operable on a processor to define interval values for each uncertain component or parameter in a circuit or system. The system may also include a data structure to replace scalar operations with interval operations in an algorithm. The system may also include a data structure to generate a plurality of scalar samples from a plurality of intervals. The system may further include a data structure to determine a distribution of each uncertain component or parameters from the scalar samples of the intervals.

In accordance with another embodiment of the present invention, a computer program product for modeling uncertainties in integrated circuits, systems, fabrication processes or the like may include a computer usable medium having computer usable program code embodied therein. The computer usable medium may include computer usable program code configured to define interval values for each uncertain component or parameter in a circuit or system. The computer usable medium may also include computer readable program code configured to generate a plurality of scalar samples from a plurality of intervals. The computer usable medium may also include computer readable program code configured to determine a distribution of each uncertain component or parameter from the scalar samples of the intervals.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

FIG. 1 is a flow chart of an example of a method for modeling uncertainties in integrated circuits, systems and fabrication processes in accordance with an embodiment of the present invention.

FIG. 2 is an exemplary system for modeling uncertainties in integrated circuits, systems and fabrication processes in accordance with an embodiment of the present invention.

FIGS. 3A(1) and (2), FIGS. 3B(1) and (2) and FIGS. 3C(1) and (2) represent examples of asymmetric regions with asymmetric affine intervals.

FIG. 4 is an example of an abstract algorithm for unary functions with asymmetric bounding.

FIG. 10 is an example of an algorithm for division of asymmetric affine intervals in accordance with an embodiment of the invention.

DESCRIPTION OF THE INVENTION

Figure 5:
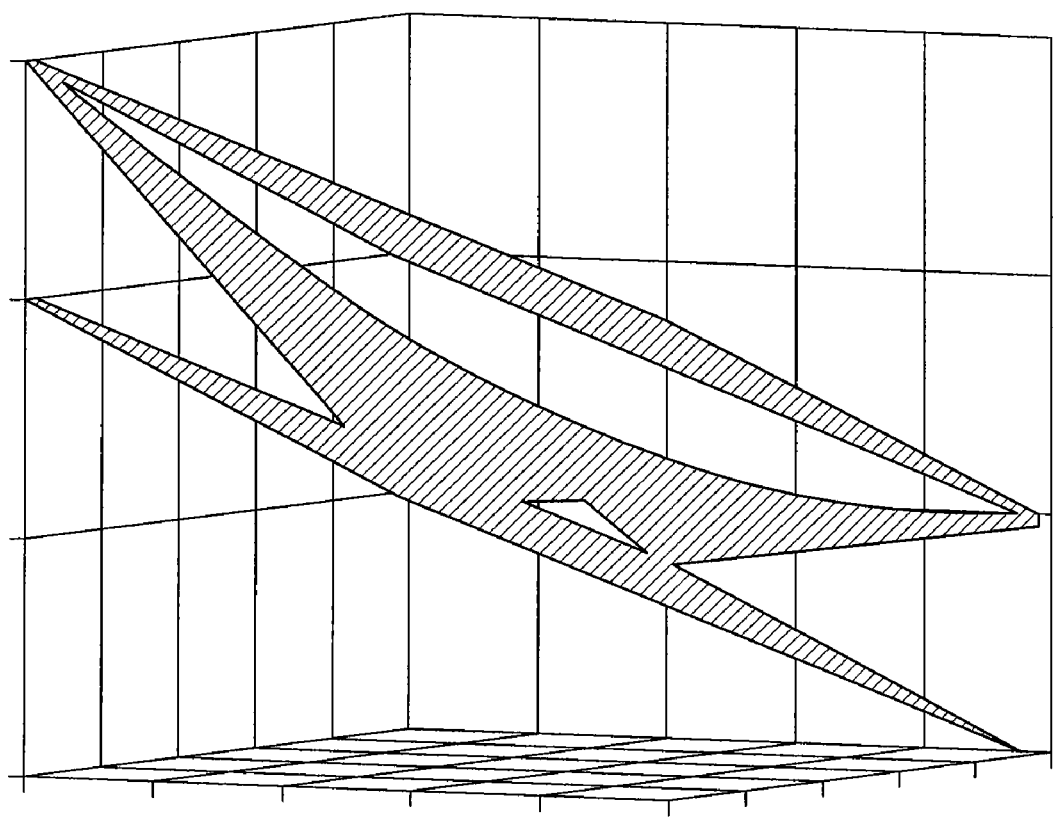
FIG. 5 is an illustration of an approximation criteria for non-affine functions showing a binary function represented by a nonlinear surface.

The following detailed description of embodiments refers to the accompanying drawings, which illustrate specific embodiments of the invention. Other embodiments having different structures and operations do not depart from the scope of the present invention.

As will be appreciated by one of skill in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

FIG. 1 is a flow chart of an example of a method 100 for modeling uncertainties in integrated circuits, systems and fabrication processes in accordance with an embodiment of the present invention. In block 102, interval values for each uncertain component or parameter in a circuit, system or the like may be defined. The interval values may be defined using a correlated affine form or a probabilistic interval form. The correlated Affine form and arithmetic and the probabilistic interval form and arithmetic are described in more detail in the following publications which are incorporated herein in their entirety by reference:

[1] J. Stolfi and L. H. de Figueiredo, "Self-Validating numerical methods and applications," in Brazilian Mathematics Colloquium Monograph, IMPA, Rio DeJaneiro, Brazil, 1997 (hereinafter Stolfi)

[2] J. D. Ma and R. A. Rutenbar, "Interval-valued reduced order statistical interconnect modeling," in Proc. Int. Conf. Computer Aided Design, 2004, pp. 460-467

[3] J. D. Ma and R. A. Rutenbar, "Fast interval-valued interconnect modeling and reduction," in Proc. Intl. Symp. Physical design, 2005, pp 159-166

[4] C. F. Fang, "Probabilistic interval-valued computation: Representing and reasoning about uncertainty in DSP and VLSI designs," Ph.D. dissertation, Department of Electrical and Computer Engineering, Carnegie Mellon University, Pittsburgh, Pa., 2005 (hereafter Fang).

Fang in Section 4.2.1, "Enforcing asymmetric bounds," "Definition," introduces an enhanced representation for affine interval—asymmetric affine interval—to mitigate the symmetry problem, and hence to improve the accuracy of non-affine operations. It consists of a basic affine interval and two enforced bounds, asymmetric around the central point. Please note that a basic affine interval also has two implied probabilistic bounds, $x_\lambda$ and $\bar{x}_\lambda$, which are symmetric around the center and bound the true range with a certain probability. To distinguish from the implied symmetric bounds, we denote the enforced asymmetric bounds by $x_l$ (for the lower bound) and $x_h$ (for the upper bound). So an asymmetric affine interval is represented by $$\hat{x}^a = \left\{ x_0 + \sum_{i=1}^{N} x_i \varepsilon_i, x_l, x_h \right\} \quad (4.2)$$

$$x_l >= x_\lambda$$

$$x_h <= \bar{x}_\lambda$$

The condition states that the enforced lower bound $x_l$ is effective only when it is larger than the probabilistic lower bound $x_\lambda$, and the enforced upper bound $x_h$ is effective only when it is smaller than the probabilistic upper bound $\bar{x}_\lambda$. In the rest of this chapter, we also use a simplified notation of (4.2), $\hat{x}^a = \{\hat{x}, [x]\}$, where $[x]$ stands for the enforced bounds, i.e., $[x]=[x_l, x_h]$.

With enforced bounds, a new affine interval $\hat{x}^a$ can represent a non-center-symmetric range. We show some examples in FIGS. 3A(1) and (2), FIGS. 3B(1) and (2) and FIGS. 3C(1) and (2). The first example is for a 1D affine interval (FIGS. 3A (1) and (2)), where the line segment described by the original interval is limited to be center-symmetric, while the new interval is capable of representing a line segment that is asymmetric around the center. The next two examples are for a 2D affine interval $\hat{x}^a \times \hat{y}^a$, in the cases of few noise symbols (FIGS. 3B (1) and (2)) and many noise symbols (FIGS. 3C (1) and (2) 2D affine interval with probabilistic interpretation), respectively. Its boundary is originally restricted to be a center-symmetric polygon or an ellipse, but now is extended to be an asymmetric part of a polygon or ellipse that is intersected with a bounding box.

Asymmetric bounds are especially powerful in curing the overshoot problem. A quick demonstration is the following. Suppose y=exp(x), where x is in [a, b]. As we have shown previously, the resulting affine interval for y implies an overly pessimistic lower bound. This problem can be fixed simply by adding a lower bound $y_l$=exp(a). However, in general, computing with asymmetric affine intervals is more complicated than this.

Fang on page 76 under the heading entitled "Interval operations with enforced bounds" provides:

An asymmetric affine interval can be viewed as a combination of a basic affine interval $\hat{x}$ and an enforced bound [x]. However, an interval operation on asymmetric affine intervals is usually more than just performing computations on the two parts separately and then aggregating the answers at the end. The coexistence of the affine interval and its asymmetric bounds affects each step during the interval computation. The only exceptions are the perfectly affine functions, namely, x±y, cx, and x±c, where the inputs having asymmetric bounds does not affect the interval computation itself, but rather passes the asymmetric bounds to the output. So in the rest of this chapter, we focus our discussion on the non-affine operations.

More specifically, an interval operation on asymmetric affine intervals is defined as $\{\hat{z}, [z]\} \leftarrow \{\hat{X}, [X]\}$, where upper case suggests that the input maybe multidimensional. The goal is to compute $\hat{z}$ and [z] as accurately as possible, based on the joint information of $\hat{X}$ and [X].

There are two main steps in the computation:
Step 1: Computing the interval. This corresponds to the procedure of $\hat{z} \leftarrow \{\hat{X}, [X]\}$. Because the selection of an affine function that approximates the target function is highly dependent on the input range, both the affine form $\hat{X}$ and the enforced bounds of the input [X] have to be taken into account when considering the input range.
Step 2: Computing the bounds. This step corresponds to the procedure of $[z] \leftarrow \{\hat{X}, [X]\}$. The enforced bounds for the output depend not only on the inputs' enforced bounds [X], but also on the affine interval $\hat{X}$, since the latter carries important information on the input correlation.

Fang in Section 4.2.2 "Unary operations on an asymmetric affine interval" provides:

Common unary non-affine operations include z=exp(x), z=log(x), z=sqrt(x) and z=1/x. The corresponding interval computation is, given the target function z=ƒ(x) and the asymmetric affine interval $\hat{x}^a = \{\hat{x}, [x]\}$, to evaluate the affine form $\hat{z}$ as well as the enforced bounds [z].

Recall that the key in finding $\hat{z}$ is to decide an affine function $ƒ^*(x) = ax+b$ that approximates the non-affine function ƒ(x). The selection of the approximating function is affected by the input range U*. When x does not have enforced bounds, the affine form of x implies two symmetric probabilistic bounds, i.e., $U^* = [\underline{x}_\lambda, \overline{x}_\lambda]$, as we have presented in the previous chapter. When x has enforced bounds, the input range U* becomes [$x_l$, $x_h$], which is no wider than [$\underline{x}_\lambda, \overline{x}_\lambda$]. Based on the new U*, we can determine the new approximating function, and hence the resulting affine form $\hat{z}$. This affine form is a more accurate estimate for z, since the new input range [$x_l$, $x_h$] is less pessimistic. However, the tradeoff, of course, is that this more accurate approximation will be more expensive to compute.

Another impact of enforcing asymmetric bounds is that it mitigates the overshoot problem. Although the minimal and maximal values of z implied by the affine form $\hat{z}$ may be too pessimistic, we can correct the lower and upper bounds by adding additional constraints $z_l$=min(ƒ($x_l$), ƒ($x_h$)) and $z_h$=max(ƒ($x_l$), ƒ($x_h$)). The abstract algorithm for unary functions is described in FIG. 4.

Fang in Section 4.2.3 "Binary operations on asymmetric affine intervals" provides:

As we have seen, unary operations on asymmetric affine intervals are fairly straightforward, as long as the input range is correctly identified. However, developing the two-step procedure for binary operations is far more challenging, especially for non-affine functions, such as multiplication and division. There are two major reasons for the arising difficulties. First, the joint range of the two inputs may fall into four different categories, namely, symmetric polygon, asymmetric polygon, full ellipse, and partial ellipse that is inside a bounding box. When the number of noise symbols in the inputs is small, the joint range is better described by a polygon. Otherwise, an approximating ellipse should be used to reduce pessimism as well as complexity. Therefore, the interval operation has to first identify the shape of the joint range, and then choose the algorithm that suits the particular category. Second, the original algorithms for multiplication and division on affine intervals described by Stolfi provide very pessimistic results, and do not offer a mechanism to incorporate a more complex input range. Hence, it is difficult to extend the original algorithms to handle the enforced asymmetric bounds.

We propose a systematic approach, called the minivolume approximation, for the first step of the interval operation, i.e., to compute the interval $\hat{z}$ based on the joint range of the inputs. The key in this step is to choose an affine function $ƒ^*$ to approximate the target non-affine function ƒ. The minivolume approximation provides a guideline on how to choose $ƒ^*$ so that a certain measure of the approximation error is minimized. The algorithm is also able to deal with any type of joint range of the inputs. In addition, even when the two inputs do not have enforced bounds, this algorithm is still superior to the original ones in that it provides tighter interval for the output.

The second step is to compute the enforced bounds for the output. A mathematical description of this procedure is to find the extreme values of ƒ(x, y) in the joint range of the two inputs. Better yet, we are interested in the "probabilistic" extreme values, i.e., the range that captures a high percentage of ƒ(x, y). However, the probabilistic asymmetric bounds are not always easy to compute. In cases where computing the "probabilistic" extreme values is infeasible or prohibitively expensive, we use the extreme values instead. Since this procedure is highly dependent on the specific function ƒ, we will offer detailed discussions in the later sections dedicated to multiplication and division.

Fang beginning on page 84 at line 7 provides:

A nonlinear binary function is represented by a nonlinear surface in the 3D space (see FIG. 5). The resulting affine form=$A\hat{x}+B\hat{y}+C+D\epsilon$ describes the space between two parallel planes, and the distance between the two planes indicates the maximum error between the approximating affine function and the original non-affine function. Using the similar principles as in the minimax criteria, we require these two planes to satisfy the following conditions:

1. The two planes should bound the nonlinear surface over the joint range of x and y
2. The vertical distance between the two planes should be minimized.

Since the volume between the two planes equals to the vertical distance times the area over the joint range of x and y, minimizing the vertical distance is equivalent to minimizing the volume of the space between the two bounding planes. Therefore, we call these two conditions the minivolume approximation criteria.

The minivolume criteria gives a general guideline as to how to choose the approximating function. However, developing the solution based on the minivolume criteria is not a trivial task. Suppose a binary function is $z=f(x, y)$, and the joint range of x and y is $U^{*xy}$. The key is to find the two bounding planes that satisfy the criteria. They are expressed as $z_1=Ax+By+C_1$ and $z_2=Ax+By+C_2$, where $C_1>C_2$. Once the two bounding planes are found, the resulting affine interval is $$\hat{z} = A\hat{x} + B\hat{y} + \frac{C_1+C_2}{2} + \frac{C_1-C_2}{2}\varepsilon_k \qquad (4.3)$$

where $\varepsilon_k$ is a new noise symbol, indicating the uncertainty of the approximation error. By letting $\varepsilon_k=\pm 1$, we can clearly see that this affine interval is bounded by $z_1$ and $z_2$.

Finding the two bounding planes can be formulated as a minimization problem:
minimize $C_1-C_2$
subject to $z>=Ax+By+C_2$ $z<=Ax+By+C_1$ $C_1>C_2$ $x,y \in U^{xy}$ where A, B, $C_1$ and $C_2$ are variables. This involves a time-consuming optimization procedure in order to determine all the unknown variables.

To simplify the problem, we fix A and B to be the partial derivatives at the center point $(x_0, y_0)$:

$$A = \frac{\partial z}{\partial x}(x_0, y_0)$$

$$B = \frac{\partial z}{\partial y}(x_0, y_0)$$

Further, since there are no constraints on the relationship of $C_1$ and $C_2$ other than $C_1>C_2$, the optimization problem can be separated into two parts, i.e., minimizing $C_1$ and maximizing $C_2$. Hence a suboptimal, but more tractable, formulation for the minivolume approximation is minimize $C_1$ and maximize $C_2$
subject to $z>=Ax+By+C_2$ $z<=Ax+By+C_1$ \qquad (4.4)

$C_1>C_2$ $x,y \in U^{xy}$ where only $C_1$ and $C_2$ are unknown, and $A=\partial z/\partial x(x_0, y_0)$, $B=\partial z/\partial y(x_0, y_0)$.

The optimization problem in (4.4) is equivalent to finding the extreme values of the function $z-(Ax+By)$, which we call the distance function, over the range of $U^{xy}$. Therefore the solution for the plane parameters is the following $$A = \frac{\partial z}{\partial x}(x_0, y_0) \qquad (4.5)$$

$$B = \frac{\partial z}{\partial y}(x_0, y_0)$$

$$C_1 = \max_{x,y \in U^{x,y}} (z - (Ax+By))$$

$$C_2 = \min_{x,y \in U^{x,y}} (z - (Ax+By))$$

The solution guarantees that over $U^{xy}$, the true result $f(x, y)$ falls in the range described by the affine interval $\hat{z}$, computed using (4.3) and (4.5). In addition, given the fixed plane parameters A and B, the volume between the two bounding planes of the affine interval $\hat{z}$ is minimized.

The main computational effort in the minivolume approximation is in finding the extreme values of the distance function $f(x, y)-(Ax+By)$ over the range of $U^{xy}$, which is dependent on the specific form of $f(x, y)$. The detailed procedures for multiplication and division are provided in the next two sections.

Fang in Section 4.2.4 "Multiplication on asymmetric affine intervals" provides:

Let us now consider the multiplication operator on asymmetric affine intervals, i.e., the evaluation of $z=xy$, given the asymmetric affine forms $\hat{x}^a=\{\hat{x}, [x]\}$ and $\hat{y}^a=\{\hat{y}, [y]\}$ for the operands x and y. It consists of two major steps: one is to compute the affine interval $\hat{z}$ using the minivolume approximation discussed in the previous section, and the other is to compute the enforced bounds [z], or to find the extreme values of xy in the joint range of x and y. In this section, we first talk about the general procedures for these two steps in the case of interval multiplication, and then separate the discussion based on whether the joint range is a polygon or an ellipse, and dive into more details for each case.

The main task in the minivolume approximation is to compute the parameters for the two bounding planes. In the case of multiplication, the parameters A and B are $$A = \frac{\partial(x \cdot y)}{\partial x}(x_0, y_0) = y_0, \quad B = \frac{\partial(x \cdot y)}{\partial y}(x_0, y_0) = x_0,$$

and the distance function is $$D(x, y) = x \cdot y - (Ax+By) \qquad (4.6)$$

$$= \left(x_0 + \sum_i x_i \varepsilon_i\right) \cdot \left(y_0 + \sum_i y_i \varepsilon_i\right) - y_0 \cdot$$

$$\left(x_0 + \sum_i x_i \varepsilon_i\right) \cdot \left(y_0 + \sum_i y_i \varepsilon_i\right)$$

$$= \left(\sum_i x_i \varepsilon_i\right) \cdot \left(\sum_i y_i \varepsilon_i\right) - x_0 y_0.$$

The remaining two parameters, namely, $C_1$ and $C_2$, equal to the extreme values of the distance function over the joint range of x and y. Let $$u = x - x_0 = \left(\sum_i x_i \varepsilon_i\right)$$

$$v = y - y_0 = \left(\sum_i y_i \varepsilon_i\right).$$

Then according to (4.6), the distance function reaches the extremes when uv are maximized or minimized, over the joint range of u and v. This joint range $U^{uv}$ has the same shape as $U^{xy}$, but centers at (0, 0). Its shape falls into one of the four categories, namely, symmetric polygon, non-symmetric polygon, full ellipse, and partial ellipse inside a bounding box. However, regardless of the shape of the joint range has, it is easy to prove that the extreme values of uv must be reached on the perimeter. Suppose $(u_1, v_1)$ is a point that is not on the perimeter. Then on the perimeter, there must exist two points $(u_1, v_2)$ and $(u_1, v_3)$ such that $v_2 \leq v_1 \leq v_3$. The following relationship holds:

$u_1 v_2 \leq u_1 v_1 \leq u_1 v_3$, when $u_1 \geq 0$, and $u_1 v_3 \leq u_1 v_1 \leq u_1 v_2$, when $u_1 < 0$.

Hence, the extreme value of uv must be reached at a point on the perimeter. Therefore the parameters $C_1$ and $C_2$ are obtained by tracing the product uv along the perimeter of the joint range $U^{uv}$.

The second step is to find the enforced bounds for the output z. Ideally, we would like to compute the "probabilistic" extreme values of xy over the joint range $U^{xy}$, meaning the asymmetric bounds that capture a high percentage of all possible values of xy. However, we found it extremely difficult without any knowledge on the distribution of xy. Even if x and y are normally distributed, there is still no closed-form solution to the distribution of the product, due to their arbitrary correlation relationship. Often, people resort to a numerical integration method to seek the distribution of xy (W.Q. Meeker and L.A. Escobar, "An Algorithm to Compute the cdf of the Product of Two Random Variables," Communications in Statistics, 23:271-280, (1994)), which is too expensive to be adopted in interval computation. Therefore we use the extreme values of xy as the enforced bounds. Following the same argument as in the first step, we can prove that the extremums of xy must be on the perimeter of the joint range of x and y. So we compute the enforced bounds [z] by tracing the product xy along the perimeter of $U^{xy}$.

Case A—$U^{xy}$ is a Polygon

Figure 6C:
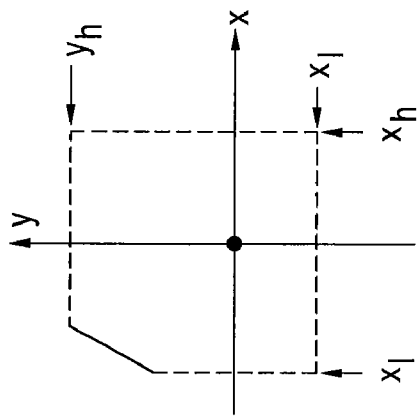
FIGS. 6A, 6B and 6C are examples of $U^{xy}$.
Figure 6B:
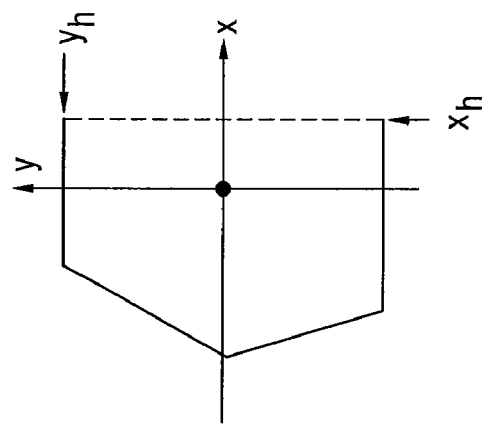
Figure 6A:
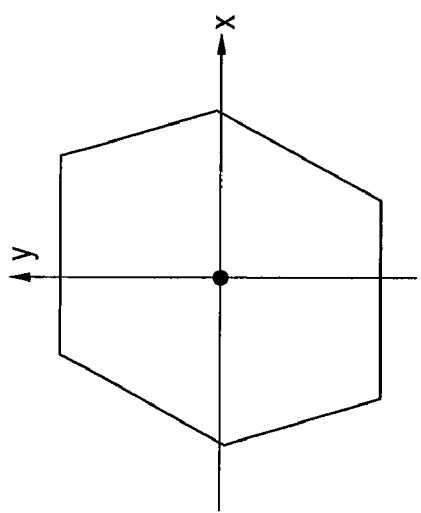

When the number of noise symbols in $\hat{x}$ and $\hat{y}$ is small and the distributions of the noise symbols are not normal, it is better to describe the joint range $U^{xy}$, and accordingly, $U^{uv}$, as a polygon. When the number of noise symbols is large or the distributions of the noise symbols are normal, the joint range can be regarded as an ellipse. More precisely, when there exists enforced bounds for x and y, the polygon may be asymmetric. Otherwise, it is symmetric around the center point. A few possible shapes of $U^{xy}$ are shown in FIGS. 6A, 6B and 6C.

Now let's first trace along the perimeter of $U^{uv}$ to solve the minivolume approximation problem. No matter what shape $U^{uv}$ has, the polygon is composed of a limited number of connected line segments, which can be sorted by their slopes. On each line segment, the extreme values of uv are possible at three points: the two end points and one potential internal point. This is proved as the following. We write each side of the polygon as $$au + bv = c \quad (4.7)$$

When $a \neq 0$ and $b \neq 0$, $$uv = \frac{1}{a}(cv - bv^2) \quad (4.8)$$

The extreme values of this quadratic function are possibly to be reached at the two end points or when $v = c/2b$. When $a = 0$ or $b = 0$, the extreme values are only possible at the two end points. Further, since the line segments are end-to-end connected, for each segment, we only need to check one end point and one interval point that corresponds to $v = c/2b$.

Suppose the extremums are found to be $\min(uv) = p$, $\max(uv) = q$, then we obtain the bounding plane parameters $C_1$ and $C_2$ as $$C_1 = q - x_0 y_0, \quad C_2 = p - x_0 y_0. \quad (4.9)$$

The resulting affine interval $\hat{z}$ for the multiplication is $$\hat{z} = A\hat{x} + B\hat{y} + \frac{C_1 + C_2}{2} + \frac{C_1 - C_2}{2}\varepsilon_k \quad (4.10)$$

$$= y_0\hat{x} + x_0\hat{y} - x_0 y_0 + \frac{p+q}{2} + \frac{q-p}{2}\varepsilon_k,$$

where $\varepsilon_k$ is a new noise symbol indicating the uncertainty of the approximation error.

With a very similar procedure, we can trace the perimeter of $U^{xy}$ and find the enforced bounds for z. The main difference is that $U^{xy}$ is symmetric around $(x_0, y_0)$, instead of (0, 0). Now, each side of the polygon can be written as $$y = y_0 + \frac{c - a(x - x_0)}{b}, \quad (4.11)$$

When $a \neq 0$ and $b \neq 0$, $$xy = y_0 x + \frac{cx - ax(x - x_0)}{b} \quad (4.12)$$

$$= -\frac{a}{b}x^2 + \left(y_0 + \frac{c + ax_0}{b}\right)x.$$

So, the extreme values of xy on each side must be found at two of the three points: the two end points and one internal point at $$x = \frac{ax_0 + by_0 + c}{2a} \quad (4.13)$$

When $a = 0$ or $b = 0$, the extreme values must be at the two end points. Thus, by tracing along the perimeter of $U^{xy}$ and checking the value of xy at one end point and one internal point on each side, we obtain the enforced bounds of z, $z_l = \min(xy)$, $z_h = \max(xy)$.

Fang on page 93 under the heading "Case B-$U^{xy}$ is a full or partial ellipse" provides:

If each input affine interval has a large number of noise symbols or the distributions of the noise symbols are normal, we can take advantage of the probabilistic interpretation of a 2D affine interval. In this case, the polygon is replaced by an ellipse that bounds the joint range with a high probability. When the inputs have enforced bounds, the joint range could be a partial ellipse, i.e., an ellipse that intercepts a range rectangle. Accordingly, the minivolume approximation is to find the two parallel planes that tightly bound the part of the nonlinear surface that projects onto the ellipse, not the entire polygon. This leads to a less pessimistic solution when many noise symbols are involved. Furthermore, constructing and tracing an ellipse is more computationally efficient than working on a polygon.

Let's first assume $U^{xy}$ and $U^{uv}$ are full ellipses. For the first step, i.e., the minivolume approximation, we trace the product of uv along the perimeter of the ellipse in the u-v plane, which has the form of $$au^2 + bv^2 + cuv = 1, \quad (4.14)$$

where the parameters a, b and c can be derived from the two input affine intervals $\hat{x}$ and $\hat{y}$; (details have been presented in Section 3.2.2). We rewrite the ellipse equation as $$u = -\frac{c}{2a}v \pm \frac{1}{2a}\sqrt{(c^2 - 4ab)v^2 + 4a}. \quad (4.15)$$

So uv can be expressed as a single variable function $$uv = -\frac{c}{2a}v^2 \pm \frac{v}{2a}\sqrt{(c^2 - 4ab)v^2 + 4a}. \quad (4.16)$$

TABLE 4.1

The four roots of equation (4.17)

$u_1 = \frac{1}{2a}(1 - c/\sqrt{4ab - c^2})\sqrt{2a - c\sqrt{a/b}}$ $v_1 = \sqrt{(2a - c\sqrt{a/b})/(4ab - c^2)}$ $u_2 = \frac{1}{2a}(-1 - c/\sqrt{4ab - c^2})\sqrt{2a - c\sqrt{a/b}}$ $v_2 = -\sqrt{(2a - c\sqrt{a/b})/(4ab - c^2)}$ $u_3 = \frac{1}{2a}(1 - c/\sqrt{4ab - c^2})\sqrt{2a + c\sqrt{a/b}}$ $v_3 = \sqrt{(2a + c\sqrt{a/b})/(4ab - c^2)}$ $u_4 = \frac{1}{2a}(-1 - c/\sqrt{4ab - c^2})\sqrt{2a + c\sqrt{a/b}}$ $v_4 = -\sqrt{(2a + c\sqrt{a/b})/(4ab - c^2)}$ Then we can find the extreme values of uv by solving $$\frac{d(uv)}{dv} = 0. \quad (4.17)$$

This involves solving a 4th-degree equation. The derivation of the solution is lengthy and appears in Appendix B of Fang. We provide the four roots of equation (4.17) in Table 4.1. Finally, the extreme values of uv are determined by evaluating it at the four roots $P_1$, $P_2$, $P_3$ and $P_4$, illustrated in FIG. 7A.

Figure 7B:
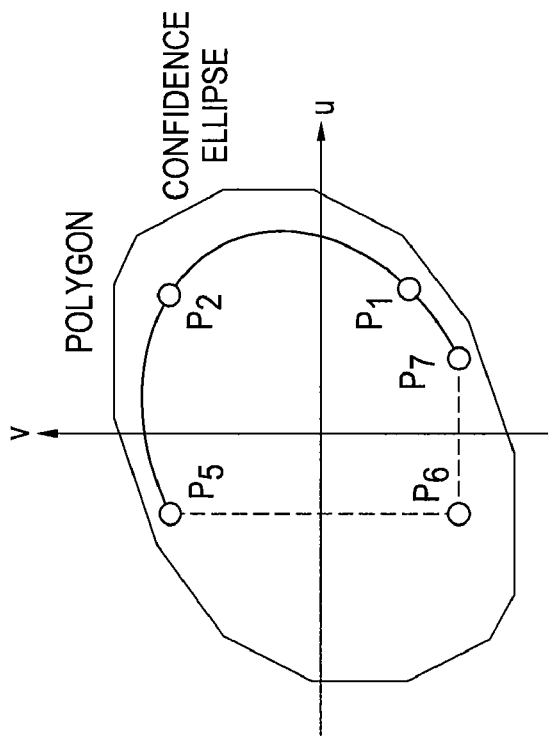
FIGS. 7A and 7B are ellipse tracings to find extremes of uv.
Figure 7A:
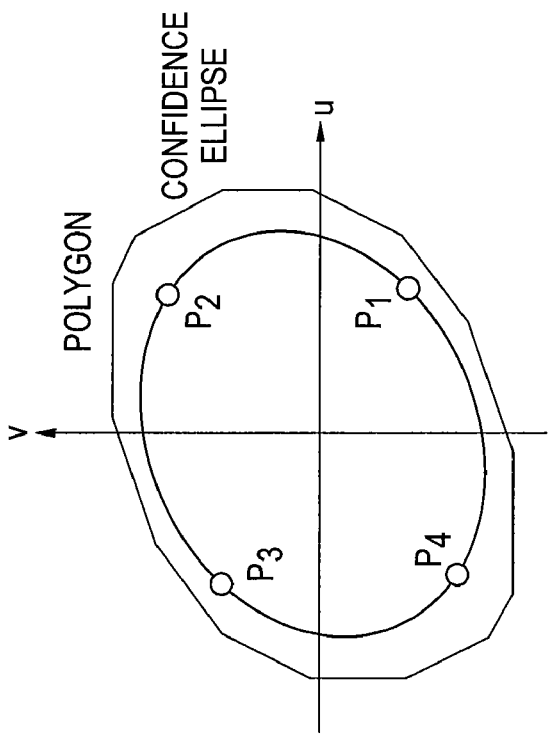

If the inputs have enforced bounds, the perimeter of $U^{xy}$ is composed of a partial ellipse and fewer than four horizontal or vertical line segments. When tracing the perimeter, we only need to evaluate the roots that are within the bounds, and those intersections between the ellipse and the bounds ($P_5$-$P_7$ FIG. 7B). With the probabilistic interpretation, the joint range of u and v is reduced from a polygon to a confidence ellipse. FIG. 7A is for tracing a full ellipse, and FIG. 7B is for tracing a partial ellipse constrained by the enforced bounds. Evaluating uv at the points $P_i$'s gives the extreme values needed for the minivolume approximation.

Similarly, we find the enforced bounds of z by tracing xy along the perimeter of the full or partial ellipse that describes $U^{xy}$. A full ellipse in the x-y plane is written as $$a(v-v_0)^2 + b(y-y_0)^2 + c(v-v_0)(y-y_0) = 1, \quad (4.18)$$

or $$x = x_0 - \frac{c}{2a}(y - y_0) \pm \frac{1}{2a}\sqrt{(c^2 - 4ab)(y - y_0)^2 + 4a}. \quad (4.19)$$

Therefore $$xy = x_0 y - \frac{c}{2a}(y - y_0) \pm \frac{y}{2a}\sqrt{(c^2 - 4ab)(y - y_0)^2 + 4a}. \quad (4.20)$$

We can find the extremums of xy along the ellipse by letting $$\frac{d(xy)}{dy} = 0. \quad (4.21)$$

Again, this leads to a rooting-finding problem of a 4th-degree equation. The equation has no more than four real roots. Details on the 4th-degree equation are given in Appendix C of Fang. By evaluating xy at the roots that are within the bounds and the intersections between the ellipse and the bounding lines, we can determine the enforced bounds of z.

Fang in Section 4.2.5 "Division on asymmetric affine intervals" provides:

Another important binary operation is division, i.e. the evaluation of z=x/y, given the asymmetric affine form $\hat{x}^a = \{\hat{x}, [x]\}$ and $\hat{y}^a = \{\hat{y}, [y]\}$ for the operands x and y. We assume the range of the denominator y does not include zero, in order for the division to be valid. The division algorithm published in Stolfi computes $\hat{z}$ indirectly by performing a multiplication of $\hat{x}$ with the reciprocal of $\hat{y}$, thus increasing the approximation error. Using the minivolume approximation, we develop a new division algorithm that directly computes the quotient, and at the same time, offers higher accuracy. The new algorithm follows the two-step procedure as we have outlined in Section 4.2.3: first to compute the affine interval $\hat{z}$ using the minivolume approximation, and then to find the enforced bounds [z] by evaluating the extreme values of x/y over the joint range $U^{xy}$. In this section, we first introduce the mechanics of these two steps, and then dive into the mathematical details for each of the two cases based on the shape of the joint range $U^{xy}$.

The key of the minivolume approximation is to find the two parallel planes, $z_1 = Ax + by + C_1$ and $z_2 = Ax + By + C_2$, that tightly bound the nonlinear surface described by the target function. For division, the plane parameters A and B are $$A = \frac{\partial \left(\frac{x}{y}\right)}{\partial x}(x_0, y_0) = \frac{1}{y_0}, B = \frac{\partial \left(\frac{x}{y}\right)}{\partial y}(x_0, y_0) = -\frac{x_0}{y_0^2}$$

And the distance function is $$\frac{x}{y} - (Ax + By) = \frac{x}{y} - \frac{x}{y_0} + \frac{x_0}{y_0^2}y \quad (4.22)$$

which is a more complex function than the counterpart of multiplication. To find the remaining two parameters $C_1$ and $C_2$, we need to compute the minimal and the maximal values of the distance function in (4.22) over the joint range of x and y. We now prove that the extreme values of the distance function must be reached on the perimeter of $U^{xy}$. Suppose $(x_1, y_1)$ is an internal point in $U^{xy}$. Then on the perimeter, there must exist two points $(x_2, y_1)$ and $(x_3, y_1)$ such that $x_2 \leqq x_1 \leqq x_3$. The distance function at $(x_1, y_1)$ is written as $$D(x_1, y_1) = \left(\frac{1}{y_1} - \frac{1}{y_0}\right)x_1 + \frac{x_0}{y_0^2}y_1 \quad (4.23)$$

If $(1/y_1 - 1/y_0) \geqq 0$, $$D(x_2, y_1) \leqq D(x_1, y_2) \leqq D(x_2, y_1) \quad (4.24)$$

Otherwise, $$D(x_2, y_1) \geqq D(x_1, y_1) \geqq D(x_2, y_1) \quad (4.25)$$

Hence, the extremums of the distance function D(x, y) must be reached at a point on the perimeter. Therefore the main task in the minivolume approximation is to trace D(x, y) along the perimeter of the joint range $U^{xy}$.

In the second step, we compute the enforced bounds of z to mitigate the overshoot problem. As we have mentioned, the ideal enforced bounds would be the "probabilistic" extreme values of x/y. However, its feasibility is dependent on whether we can efficiently compute the distribution of x/y. Luckily, when the joint range $U^{xy}$ can be regarded as an ellipse, we find an analytical solution to the distribution, and hence the "probabilistic" extreme values of x/y. For the other situations, we still use the extreme values of x/y as the enforced bounds for z. Similar to the argument in the first step, we can easily prove that the extremums of x/y must be on the perimeter of the joint range. So when computing the "probabilistic" extreme values is not feasible, we find the enforced bounds by tracing x/y along the perimeter of $U^{xy}$.

Case A—$U^{xy}$ is a polygon

When the joint range is a polygon, the first thing is to evaluate the distance function on each side of the polygon and find out the extremums. Any side of a polygon can be written as $$ax + by + c = 0 \quad (4.26)$$

When a=0 or b=0, the extremums of the distance function are possible only at the two ends of the line segment. Otherwise, we rewrite the line equation as $$x = \frac{1}{a}(c - by) \quad (4.27)$$

and hence the distance function on the line equals $$D(x, y) = \frac{x}{y} - \frac{x}{y_0} + \frac{x_0}{y_0^2}y \quad (4.28)$$

$$= \left(\frac{1}{y} - \frac{1}{y_0}\right)\frac{c - by}{a} + \frac{x_0}{y_0^2}y$$

$$= my + \frac{n}{y} + l,$$

where $$m = \frac{x_0}{y_n^2} + \frac{b}{ay_n} \quad (4.29)$$

$$n = \frac{c}{a}$$

$$l = -\left(\frac{b}{a} + \frac{c}{ay_m}\right)$$

We can find the extremums by letting $$\frac{dD(x, y)}{dy} = 0$$

The answer is, if $m \cdot n \leqq 0$, the extremums are reached at the two end points, and otherwise, the extremums are possible at two additional internal points where $$y = \pm\sqrt{\frac{n}{m}} \quad (4.30)$$

Therefore, on each side of the polygon, the distance function is evaluated at 2-4 points.

Suppose the extreme values of the distance function are found to be $$C_1 = \max_{U^{xy}} D(x, y), C_2 = \min_{U^{xy}} D(x, y)$$

The resulting affine interval for the quotient x/y is $$\hat{z} = \frac{\hat{x}}{y_0} - \frac{x_0}{y_0^2}\hat{y} + \frac{C_1 + C_2}{2} + \frac{C_1 - C_2}{2}\varepsilon_k \quad (4.31)$$

Let's now consider the second step, i.e., to compute the extreme values of x/y by tracing the perimeter of Uxy. When a side of the polygon is parallel to the x-axis or the y-axis, the extremums of x/y are possible only at the two ends of the line segment. Otherwise, x/y on a side equals $$\frac{x}{y} = \frac{\frac{1}{a}(c - by)}{y} \quad (4.32)$$

$$= \frac{1}{a}\left(\frac{c}{y} - b\right)$$

whose extremums are possible only at the ends of the line segment as well. Therefore, by evaluating x/y on the vertices of the polygon, we obtain the enforced bounds of z, $z_l$=min (x/y), $z_h$=max (x/y)

Case B—$U^{xy}$ is a full or partial ellipse

When there is a larger number of noise symbols in each affine form of the inputs or the distributions of the noise symbols are normal, the joint range $U^{xy}$ can be reduced from a polygon to a confidence ellipse. The enforced bounds of the inputs may further cut it down to a partial ellipse. Consequently, the new division algorithm needs to be adjusted to reflect the change in the joint range.

For the sake of simplicity, we first assume $U^{xy}$ is a full ellipse. For the minivolume approximation, we trace the value of the distance function D(x, y) along the ellipse, which is described by $$a(x-x_0)^2 + b(y-y_0)^2 + c(x-x_0)(y-y_0) = 1 \quad (4.33)$$

or $$x = x_0 - \frac{c}{2a}(y-y_0) \pm \frac{1}{2a}\sqrt{(c^2 - 4ab)(y-y_0)^2 + 4a} \quad (4.34)$$

Then the distance function on the ellipse can be written as a function of y $$D(x, y) = \frac{x}{y} - \frac{x}{y_0} + \frac{x_0}{y_0^2}y \quad (4.35)$$

$$= \left[\left(\frac{1}{y} - \frac{1}{y_0}\right)[x]_0 - \frac{c}{2a}(y-y_0) \pm \frac{1}{2a}\sqrt{(c^2 - 4ab)(y-y_0)^2 + 4a}\right] + \frac{x_0}{y_0^2}y$$

Theoretically, we can obtain the extreme values of D(x, y) on the ellipse by solving $$\frac{dD(x, y)}{dy} = 0$$

Unfortunately, this leads to a 6th-degree equation solving problem, which does not have an analytical solution.

Figure 8B:
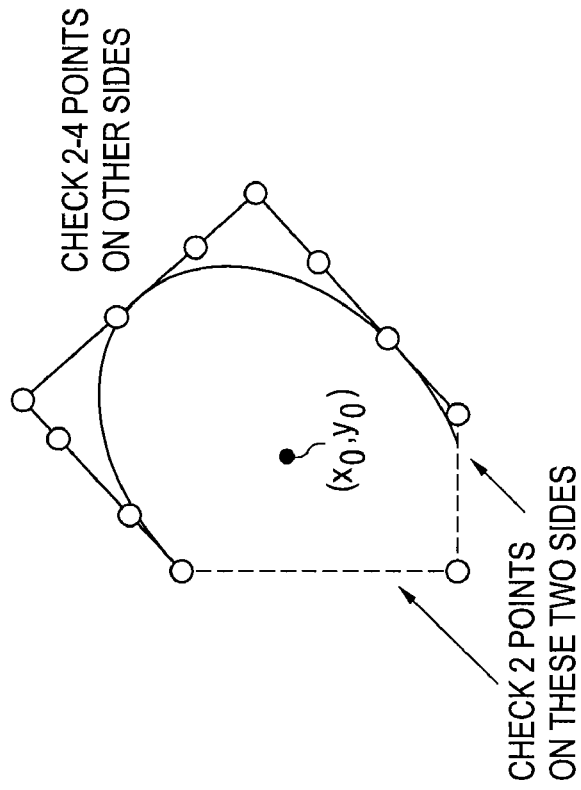
FIG. 8A is a tracing of the bounding box of a full ellipse and FIG. 8B is a tracing of the bounding box of a partial ellipse.
Figure 8A:
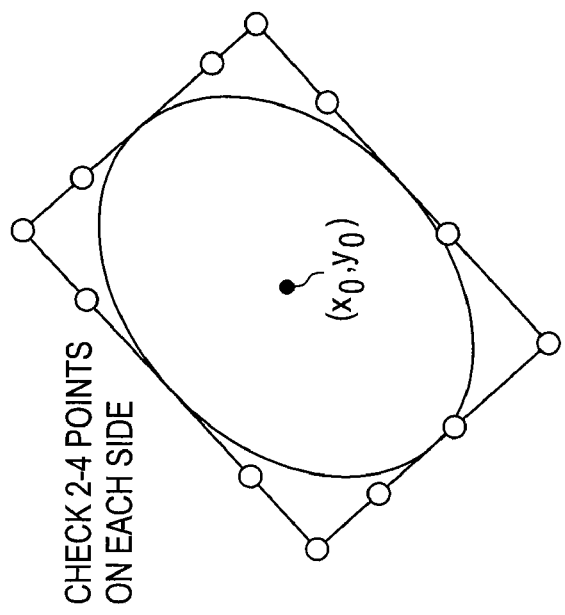

Therefore, we seek an approximate solution to the extremums of the distance function by conservatively simplifying the ellipse with a rectangular bounding box (see FIG. 8A). The sides of the bounding box are parallel to the principle axes of the ellipse. Note that since a rectangle is a special polygon, the extremums of the distance function on the rectangle can be computed exactly the same way as in Case A. On each side of the rectangle, we need to evaluate the distance function at 2-4 points.

If there exist enforced bounds, we simply replace the true range $U^{xy}$ with a conservative approximation, i.e., the polygon intersected by the rectangular bounding box and the enforced bounds (see FIG. 8B). Similarly, on each side of the polygon, the extremums of the distance function are possible at 2-4 points.

Next, we discuss how the enforced bounds of z are computed. Luckily, in this case, we are able to find the "probabilistic" extreme values of x/y through the knowledge on the distribution of x/y. As we know, when $\hat{x}$ and $\hat{y}$ have many noise symbols, their distributions can be regarded as normal distributions, and therefore the essential problem is to find out the distribution of the quotient of two normal random variables. By utilizing the results in G. Marsaglia, "Ratios of Normal Variables and Ratios of Sums of Uniform Variables," Journal of the American Statistical Association, 60(309): 193-204, Mar. 1965, we obtain the CDF of z as the following, $$P(z < s) = \begin{cases} \Phi\left(\frac{\frac{b(s-c_1)}{c_2} - a}{\sqrt{1 + \left(\frac{s-c_1}{c_2}\right)^2}}\right), & \text{when } c_2 > 0 \\ 1 - \Phi\left(\frac{\frac{b(s-c_1)}{c_2} - a}{\sqrt{1 + \left(\frac{s-c_1}{c_2}\right)^2}}\right), & \text{otherwise} \end{cases} \quad (4.36)$$

where $\Phi(x)$ is the standard normal CDF. The complete derivation and the constants $c_1$, $c_2$, and a are detailed in Appendix D of Fang.

From (4.36), we are able to find the probabilistic lower and upper bounds, zl and zh, that satisfy:

$$P(z < z_l) \leq \delta, P(z > z_h) \leq \delta$$

where $\delta$ is a small number, for example, 0.05%. Note that on the x-y plane, the lower and upper bounds of x/y are reached on two straight lines, shown in FIG. 9A. They are x/y=$z_l$, and x/y=$z_h$.

Figure 9B:
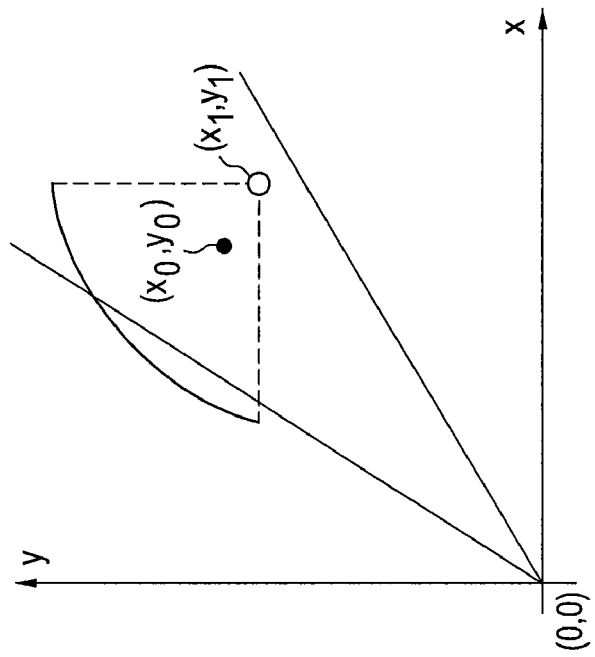
FIGS. 9A and 9B are examples of an enforced bound for $z=x/y$.
Figure 9A:
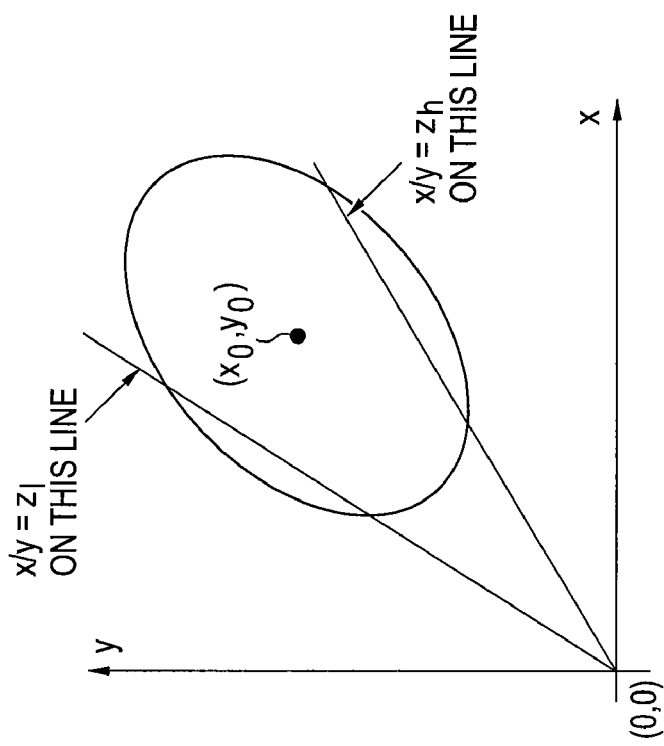

However, when the inputs x and y have enforced bounds, it is possible that the $z_l$ and $z_h$ computed above may not be reached. An example is shown in FIG. 9B. In this case, the line x/y=$z_h$ is excluded from the joint range $U^{xy}$, and the true upper bounded is reached at ($x_1$, $y_1$) which is the intersection between two bounding lines. Therefore, when dealing with a partial ellipse, we should also compute the values of x/y at the intersections between any two bounding lines and adjust $z_l$ and $z_h$ accordingly.

Division algorithm summary

Finally, we summarize the complete division algorithm in FIG. 10. In the description, $U^{xy}$ stands for the joint range of x and y, and D(x, y) is the distance function in (4.6). The input affine interval $\hat{x}$ and $\hat{y}$ have $N_1$ and $N_2$ noise symbols, respectively.

In one embodiment of the present invention, the correlated uncertain resistance, capacitance, and inductance of an uncertain interconnect circuit are represented in correlated affine interval forms.

In block 104, a set of arithmetic interval operations may be defined. In block 106, scalar operations may be replaced with interval operations in an algorithm, such as a computer aided design (CAD) algorithm or the like. In block 108, interval operations may be discontinued in the algorithm in response to a predetermined condition occurring. One embodiment of the present invention is analyzing the delay or other possible characteristics of an uncertain interconnect circuit that consists of correlated interval-valued resistance, interval-valued capacitance, and interval-valued inductance. Scalar operations in a typical interconnect circuit moment computation algorithm are replaced with their counterpart interval operations, until a predetermined number of interval-valued circuit moments are generated.

In block 110, a plurality of scalar samples may be generated from the plurality of intervals. In one embodiment of the present invention, circuit moment intervals may be sampled, or pole and residue intervals or the like may be sampled, using Monte Carlo sampling or a similar sampling technique.

In block 112, a distribution of each uncertainty component or parameter may be determined from the plurality of scalar samples of the intervals. As in one embodiment of the present invention, a distribution of a circuit delay may be determined as well as other possible characteristics of the circuit being analyzed, from the plurality of the scalar samples of the pole and residue intervals.

FIG. 2 is an exemplary system 200 for modeling uncertainties in integrated circuits, systems and fabrication processes in accordance with an embodiment of the present invention. The method 100 may be implemented by and embodied in the system 200. The system 200 may include a system bus 202. The system 200 may also include a processor 204 that may be coupled to the system bus 202. An operating system 206 may be operable on the processor 204 to control overall operation of the system 200 and operation of applications, programs or modules that may be stored in a system memory 208. The system memory 208 may also be coupled to the system bus 202.

The system memory 208 may include a random access memory (RAM) 210 or the like to store software, modules, applications, data structures or the like to be performed by the system 200. Software, programs, modules or the like may include a module 212 for modeling uncertainties in integrated circuits (ICs), systems, fabrication processes or the like. The methods 100 may be embodied in the module 212 as computer-usable or computer-executable instructions or data structures stored in the system memory 208. The system memory 208 may include other modules 214, applications, data structures or the like to perform other operations.

The system 200 may also include one or more input devices, such as input devices 216 and 218. The input devices 216 and 218 may be coupled to the system bus 202 via an input/output interface 220 or the like. The input devices 216 may be optical, magnetic, infrared, voice recognition or radio frequency input devices or the like. The input devices 216 may receive, read or download software or the like, such as software embodying the method 100, from a medium 222. Examples for the medium 222 may be or form part of a communication channel, memory or similar devices. The medium 222 may be any medium that may contain, store, communicate or transport the data embodied therein for use by or in connection with the input device 216 or the system 200. The medium 222 may, for example, be an electronic, magnetic, optical, electromagnetic, infrared or semiconductor system or the like. The medium 222 may also be simply a stream of information being retrieved when the data is "downloaded" through a network such as the Internet or a private network. The input devices 216 and 218 may include a keyboard, pointing device or the like. The input device 218 may receive data 224 that may be related to an IC fabrication process, a circuit, system or the like for use by the module 212 for modeling uncertainties in accordance with an embodiment of the present invention.

The system 200 may also include one or more output devices 226. The output devices 226 may also be coupled to the system bus 202 via an I/O interface 220 or the like. The output devices 226 may include a display or monitor, printer, audio system or the like. The output devices 226 may be used to present indications to a user related to operation of the module 212, such as the distributions, circuit delay or the like, similar to that discussed with respect to block 212 (FIG. 1). The output device 226 may also be coupled to a medium similar to medium 222, disk drive or the like.

The system 200 may also be coupled to a communication network or medium 228. The communication medium or network 228 may be coupled to the system bus 202 via an I/O interface 220 or the like. The communication network or medium 228 may be any communication system including by way of example, dedicated communication lines, telephone networks, wireless data transmission systems, two-way cable systems, customized computer networks, interactive kiosk networks, the Internet and the like. The system 200 may also receive data for use with the module 212 for modeling uncertainties via the communications network or medium 228.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A computer implemented method for determining uncertainties in integrated circuits, systems and fabrication processes, comprising:

defining by a computer system an interval representation for each uncertain component or parameter in a circuit or system;

defining by the computer system a set of arithmetical interval operations, wherein the interval representation includes a basic affine interval and two enforced bounds asymmetric around a central point, the enforced bounds for an output of any arithmetic interval operation depending upon the two enforced bounds and the affine interval of at least one operand of the arithmetic interval operation;

replacing scalar operations with interval operations in an algorithm;

discontinuing interval operations in the algorithm in response to a predetermined condition;

generating by the computer system a plurality of scalar samples from a plurality of intervals; and determining by the computer system a distribution of each uncertain component or parameter from the plurality of scalar samples of the intervals.

2. The method of claim 1, wherein generating the plurality of scalar samples comprises sampling a plurality of circuit moment intervals or pole and residue intervals.

3. The method of claim 1, wherein determining the distribution of each uncertain component or parameter comprises determining a circuit delay.

4. The method of claim 1, wherein the algorithm comprises a computer aided design (CAD) algorithm.

5. The method of claim 1, further comprising discontinuing interval operations in the algorithm in response to generating a predetermined number of interval moments or interval poles and residues.

6. The method of claim 1, wherein generating the scalar samples from the intervals, comprises Monte Carlo sampling.

7. The method of claim 1, wherein generating scalar samples comprises at least one of sampling circuit moment intervals or sampling pole and residue intervals.

8. The method of claim 7, wherein the sampling comprises Monte Carlo sampling.

9. The method of claim 1, wherein determining a distribution of each uncertain component or parameter comprises determining a distribution of an uncertain circuit delay.

10. The method of claim 1, further comprising using a correlated affine interval form or a probabilistic interval form to define interval values for each uncertain component or parameter in the circuit or system.

11. A computer implemented method for determining uncertainties in integrated circuits, systems and fabrication processes, comprising:

defining by a computer system an interval representation for each uncertain component or parameter in a circuit or system;

defining by the computer system a set of arithmetical interval operations, wherein the interval representation includes a basic affine interval and two enforced bounds asymmetric around a central point, the enforced bounds for an output of any arithmetic interval operation depending upon the two enforced bounds and the affine interval of at least one operand of the arithmetic interval operation;

replacing by the computer system scalar operations with interval operations in an algorithm;

discontinuing by the computer system interval operations in the algorithm in response to a predetermined condition generating a plurality of scalar samples from a plurality of intervals; and determining by the computer system a distribution of each uncertain component or parameter from the plurality of scalar samples of the intervals.

12. The method of claim 11, wherein generating the plurality of scalar samples comprises sampling a plurality of circuit moment intervals or pole and residue intervals.

13. The method of claim 11, wherein determining the distribution of each uncertain component or parameter comprises determining a distribution of an uncertain circuit delay.

14. The method of claim 11, further comprising using a correlated affine interval form or a probabilistic interval form to define interval values for each uncertain component or parameter in the circuit or system.

15. A system for determining uncertainties in integrated circuits, systems and fabrication processes, comprising:

a processor;

a system memory;

a data structure stored on the system memory and operable on the processor to define an interval representation for each uncertain component or parameter in a circuit or system;

a data structure stored on the system memory and operable on the processor to define a set of arithmetical interval operations, wherein the interval representation includes a basic affine interval and two enforced bounds asymmetric around a central point, the enforced bounds for an output of any arithmetic interval operation depending upon the two enforced bounds and the affine interval of at least one operand of the arithmetic interval operation;

a data structure stored on the system memory and operable on the processor to replace scalar operations with interval operations in a algorithm;

a data structure stored on the system memory and operable on the processor to discontinue interval operations in the algorithm in response to a predetermined condition;

a data structure stored on the system memory and operable on the processor to generate a plurality of scalar samples from a plurality of intervals; and a data structure stored on the system memory and operable on the processor to determine a distribution of each uncertain component or parameters from the scalar samples of the intervals.

16. The system of claim 15, wherein the algorithm comprises a computer aided design (CAD) algorithm.

17. The system of claim 15, wherein the data structure to generate the plurality of scalar samples from the intervals comprises a data structure to perform Monte Carlo sampling.

18. The system of claim 15, further comprising a data structure stored on the system memory and operable on the processor to sample a plurality of circuit moment intervals or pole and residue intervals.

19. The system of claim 15, further comprising an output device to present a representation of a distribution of an uncertain circuit delay.

20. A computer program product for determining uncertainties in integrated circuits, systems and fabrication processes, the computer program product comprising:

a computer readable storage medium having computer readable program code embodied therein, the computer readable storage medium comprising:

computer readable program code configured to define an interval representation for each uncertain component or parameter in a circuit or system;

computer readable program code configured to define by the computer system a set of arithmetical interval operations, wherein the interval representation includes a basic affine interval and two enforced bounds asymmetric around a central point, the enforced bounds for an output of any arithmetic interval operation depending upon the two enforced bounds and the affine interval of at least one operand of the arithmetic interval operation;

computer readable program code configured to generate a plurality of scalar samples from a plurality of intervals; and computer readable program code configured to determine a distribution of each uncertain component or parameter from the scalar samples of the intervals.

21. The computer program product of claim 20, comprising:
- computer readable program code configured to define a set of arithmetical interval operations;
- computer readable program code configured to replace scalar operations with interval operations in a algorithm; and
- computer readable program code configured to discontinue interval operations in the algorithm in response to a predetermined condition.

22. The computer program product of claim 20, further comprising computer readable program code configured to perform Monte Carlo sampling to generate the scalar samples from the intervals.

23. The computer program product of claim 20, further comprising computer readable program code configured to define interval values for each uncertain component or parameter in a circuit or system using a correlated affine interval form or a probabilistic interval form.

24. The computer program product of claim 20, further comprising computer readable program code configured to determine a distribution of an uncertain circuit delay.

* * * * *